US008222657B2

(12) United States Patent
Xu et al.

(10) Patent No.: US 8,222,657 B2
(45) Date of Patent: Jul. 17, 2012

(54) LIGHT EMITTING APPARATUS (75) Inventors: Jian Xu, State College, PA (US);
Somasundaram Ashok, State College, PA (US)

(73) Assignee: The Penn State Research Foundation, University Park, PA (US)

(*) Notice: Subject to any disclaimer, the term of this patent is extended or adjusted under 35 U.S.C. 154(b) by 295 days.

(21) Appl. No.: 12/708,104

(22) Filed: Feb. 18, 2010

(65) Prior Publication Data

US 2010/0213477 A1 Aug. 26, 2010

Related U.S. Application Data (60) Provisional application No. 61/154,601, filed on Feb. 23, 2009.

(51) Int. Cl.
*H01L 33/00* (2010.01)
(52) U.S. Cl. .......... 257/94; 438/291; 438/752; 438/933; 257/E33.013; 257/E33.016; 257/613; 257/614; 257/616
(58) Field of Classification Search .............. 438/22–47, 438/291, 752, 933; 257/613–616, 94, E33.013, 257/E33.016
See application file for complete search history.

(56) References Cited

U.S. PATENT DOCUMENTS

| 5,798,555 | A | * | 8/1998 | Mishra et al. ............ 257/410 |
| 6,059,895 | A | * | 5/2000 | Chu et al. ............... 148/33.1 |
| 6,177,690 | B1 | * | 1/2001 | Noguchi et al. ............ 257/96 |
| 6,384,430 | B1 | * | 5/2002 | Nakatsu et al. ........... 257/103 |
| 6,784,466 | B2 | * | 8/2004 | Chu et al. ............... 257/194 |
| 6,917,096 | B2 | * | 7/2005 | Sugiyama et al. ......... 257/616 |
| 7,244,972 | B2 | * | 7/2007 | Kubo et al. .............. 257/194 |
| 7,393,735 | B2 | * | 7/2008 | Chu et al. ............... 438/172 |
| 7,435,987 | B1 | * | 10/2008 | Chui et al. ............... 257/14 |
| 7,566,606 | B2 | * | 7/2009 | Currie et al. ............. 438/199 |
| 7,713,803 | B2 | * | 5/2010 | Jin et al. ................. 438/172 |
| 7,728,387 | B1 | * | 6/2010 | Krishnamohan et al. .... 257/369 |

(Continued)

FOREIGN PATENT DOCUMENTS

GB  2387966 A  10/2003

(Continued)

OTHER PUBLICATIONS

International Preliminary Report on Patentability for PCT/US2010/024651 dated Aug. 23, 2011.

(Continued)

*Primary Examiner* — N Drew Richards
*Assistant Examiner* — Ankush Singal
(74) *Attorney, Agent, or Firm* — Buchanan Ingersoll & Rooney PC (57) ABSTRACT

A light emitting apparatus may include a gate metal positioned between a p-type contact and an n-type contact, a gate oxide or other dielectric stack positioned below and attached to the gate metal, a Ge or $Si_{1-z}Ge_z$ channel positioned below and attached to the gate dielectric stack, a buffer, and a silicon substrate positioned below and attached to the buffer. The light emitting apparatus may alternatively include a gate metal positioned between a p-type contact and an n-type contact, a wide bandgap semiconductor positioned below and attached to the gate metal, a Ge or $Si_{1-z}Ge_z$ channel positioned below and attached to the wide bandgap semiconductor, a buffer, and a silicon substrate positioned below and attached to the buffer. Embodiments of the light emitting apparatus may be configured for use in current-injected on-chip lasers, light emitting diodes or other light emitting devices.

19 Claims, 8 Drawing Sheets

U.S. PATENT DOCUMENTS

| | | | |
|---|---|---|---|
| 7,968,913 B2* | 6/2011 | Hopper et al. | 257/194 |
| 8,044,434 B2* | 10/2011 | Ohta et al. | 257/194 |
| 2002/0101895 A1* | 8/2002 | Augusto | 372/44 |
| 2002/0125475 A1* | 9/2002 | Chu et al. | 257/55 |
| 2002/0179946 A1* | 12/2002 | Hara et al. | 257/288 |
| 2004/0070051 A1* | 4/2004 | Sugiyama et al. | 257/616 |
| 2004/0147079 A1* | 7/2004 | Forbes et al. | 438/270 |
| 2004/0150004 A1* | 8/2004 | Aoki et al. | 257/197 |
| 2005/0017257 A1* | 1/2005 | Green et al. | 257/98 |
| 2005/0035362 A1* | 2/2005 | Nitta et al. | 257/98 |
| 2005/0077510 A1* | 4/2005 | Chu et al. | 257/19 |
| 2005/0127392 A1* | 6/2005 | Chu et al. | 257/103 |
| 2005/0211982 A1* | 9/2005 | Lei et al. | 257/65 |
| 2006/0292776 A1* | 12/2006 | Jin et al. | 438/197 |
| 2007/0096171 A1 | 5/2007 | Lin | |
| 2007/0105251 A1 | 5/2007 | Liu | |
| 2007/0120208 A1* | 5/2007 | Mitra | 257/417 |
| 2007/0126014 A1* | 6/2007 | Liao et al. | 257/94 |
| 2008/0054249 A1* | 3/2008 | Xie | 257/14 |
| 2008/0089375 A1* | 4/2008 | Kanskar et al. | 372/45.012 |
| 2008/0237572 A1* | 10/2008 | Chui et al. | 257/14 |
| 2008/0298410 A1 | 12/2008 | Cheng | |
| 2009/0184346 A1* | 7/2009 | Jain | 257/288 |
| 2010/0006894 A1* | 1/2010 | Ohta et al. | 257/192 |
| 2010/0029039 A1* | 2/2010 | Shan et al. | 438/98 |
| 2010/0078682 A1* | 4/2010 | Ngai et al. | 257/192 |

FOREIGN PATENT DOCUMENTS

WO 02097894 A1 12/2002

OTHER PUBLICATIONS

Martin Kittler, et al., "Silicon based IR light emitters" Physical status Solidi C., vol. 6, No. 3, Jan. 14, 2009.

International Search Report, Jul. 27, 2010, International Application No. PCT/US2010/024651.

* cited by examiner

LIGHT EMITTING APPARATUS

CROSS REFERENCE TO RELATED APPLICATION

The present application claims priority to U.S. Provisional Patent Application No. 61/154,601, filed on Feb. 23, 2009. The entirety of U.S. Provisional Patent Application No. 61/154,601 is incorporated by reference herein.

FIELD OF THE INVENTION

The present invention relates to light emitting apparatuses such as semiconductors, light emitting diodes (LEDs), laser diodes and other light emitting devices.

BACKGROUND OF THE INVENTION

Basic components of a computer and other electronic devices include memory, central processing units, a power source and various circuits. Integrated circuit chips are often utilized in such devices. Although the processing speed of the mentioned components can be elevated, the electrical resistance and capacitance of the wires connecting each integrated circuit chip and connecting the integrated circuit chips with the major components are increased due to the miniaturization, which can result in delayed signals and reduced speed.

The ultimate monolithic integration of silicon photonic circuitry and advanced silicon microelectronics may unlock the true power of tomorrow's computers and networks because of vast data capacity, transmission distance, and insensitivity to electromagnetic interference and cross-talk. A key target in the roadmap of silicon photonics is the development of high-performance, current-injected on-chip lasers that can be monolithically fabricated on silicon. While III-V laser junctions have been bonded to silicon waveguides where the emitted light is transmitted, the needed high-quality III-V structures typically cannot be grown directly on the silicon (Si).

It has been highly desirable to have Germanium (Ge) and silicon germanium (SiGe) as potential light emitting media or lasing media. The Ge or SiGe media can be fabricated on silicon utilizing known Group IV epitaxy techniques and with monolithic integration to form silicon electronic integrated circuits. The $\Gamma$ valley-based direct band gap of unstrained germanium is $E_g^\Gamma=0.8$ eV, which translates to the wavelength of the band edge transition at $\lambda=1.55$ μm (the silica optical fiber wavelength).

However, an intrinsic bulk germanium material is an indirect semiconductor with an indirect band gap ($E_g^L=0.67$ eV) at L valley, ~136 meV below the $\Gamma$ valley minimum. Free electrons tend to populate the L valley first when they are optically or electrically injected into the germanium material. Momentum conservation requires the presence of phonons to assist the radiative electron-hole recombination via the indirect band gap, which significantly lowers the radiative efficiency of germanium. The radiative recombination of $\Gamma$ valley-electrons and holes through the direct gap will not take place until the L valley is filled by the injected electrons up to the level that energetically matches the minimum of the $\Gamma$ valley, i.e., ~136 meV above the bottom of the L valley. The density of the injected currents for the occurrence of radiative recombination and the onset of population inversion in the direct gap ($\Gamma$ valley) is impractically high in bulk for Ge or SiGe based media.

U.S. Patent Application Publication No. 2007/0105251 to Liu et al. discloses a strain and n-type doping engineering that provides population inversion in the direct bandgap of Ge: the tensile strain decreases the difference between the L valleys and the $\Gamma$ valley while the extrinsic electrons from n-type doping fill the L valleys to the level of the $\Gamma$ valley to compensate for the remaining energy difference. The disclosed doping provides a Ge laser structure containing a tensile-strained n+ germanium active layer epitaxially grown over a p-type layer of silicon (Si) or Ge or SiGe, with or without an intermediate region. An optical gain of 400 cm$^{-1}$ was theoretically predicted for a 0.4% tensile-strained n+ germanium ($7.6\times10^{19}$ cm$^{-3}$) by considering the free-carrier losses in the heavily doped material.

The very high doping level that is necessary for the L-valley filling in Ge ($n \geq 10^{19}$ cm$^{-3}$) disclosed by Liu et al, will inevitably introduce (1) a large number of nonradiative recombination centers and (2) significantly enhanced the Auger recombination in the material, both of which will compete with and hence reduce the net radiative recombination rate in germanium and provide inefficient light emission. The band tailing effect associated with such heavy doping could also lower the direct bandgap of germanium, turning the emitting wavelength away from the desired 1.55 μm.

U.S. Patent Application Publication No. 2008/0298410 to Cheng et al. discloses infrared emission from a metal-insulator-germanium tunnel diode that occurs at a wavelength near the indirect L-valley gap of Ge. Cheng et al. invoke the idea that holes should be tunnel-injected from a metal gate through an ultra-thin layer of dielectric into the underlying germanium layer where they recombine with electrons to emit light. At a positive gate bias, the electron confinement at the insulator/germanium interface gives rise to the spread of the momentum for the localized electrons, which works together with the phonons, the Ge/oxide interface roughness, and the impurities therein to provide the necessary momentum for radiative recombination. The extracted band gaps from the EL spectra from the Ge metal insulator semiconductor (MIS) tunneling diode are 40 meV lower than the indirect band gap obtained from Varshni's equation at the measurement temperatures, suggesting involvement of the longitudinal acoustic (LA) phonons in the momentum conservation of the radiative recombination. The dominance of the indirect band transition in the Ge MIS tunneling diode is also confirmed by the low carrier density ($8\times10^{17}$ cm$^{-3}$) in the light emission region, which is not high enough to fill up the L valley for direct band transition. The radiation efficiency of the MIS tunneling diode will essentially be limited by the phonon density state in Ge. In addition, carrier trapping and de-trapping cycles in the insulator often accompany the electron tunneling process, which further reduce the efficiency of the device.

A high-performance, current-injected on-chip laser, light emitting diode or other light emitting device that can be monolithically fabricated on silicon is needed. Such on-chip devices preferably operate at the silica optical fiber communication wavelength ($\lambda=1.55$ μm). Preferably, the fabrication of the light emission devices is compatible with Complementary Metal Oxide Semiconductors (CMOS) technology in order to make full use of its billion-dollar industrial tools and facilities.

SUMMARY OF THE INVENTION

A light emitting apparatus may be a laser device, light emitting diode, current-injected on-chip laser, or other light emitting device. One embodiment of our light emitting apparatus includes a gate metal, a gate oxide or other dielectric stack, a Ge or $Si_{1-z}Ge_z$ channel, a buffer comprised of silicon (Si) and germanium (Ge) and a silicon substrate. The gate metal is positioned between a p-type contact and an n-type contact. The gate oxide or other dielectric stack is positioned below and attached to the gate metal. The Ge or $Si_{1-z}Ge_z$ channel is configured to radiate via direct band transition. The Ge or $Si_{1-z}Ge_z$ channel is positioned below and attached to the gate dielectric stack. The buffer is positioned below and attached to the Ge or $Si_{1-z}Ge_z$ channel. The silicon substrate is positioned below and attached to the buffer.

The buffer may be comprised of a relaxed $Si_{1-x}Ge_x$ buffer positioned below and attached to the Ge or $Si_{1-z}Ge_z$ channel and a graded $Si_{1-y}Ge_y$ buffer positioned below and attached to the relaxed $Si_{1-x}Ge_x$ buffer. Preferably, y is between 0 and x and z is greater than or equal to x.

In some embodiments of the light emitting apparatus, a silicon cap may be positioned between the gate dielectric stack and the Ge or $Si_{1-z}Ge_z$ channel. A high stress dielectric film may be positioned above and attached to the gate metal as well.

Preferably, the silicon substrate is silicon wafer z is a value that is greater than 0 and x and y are between 0 and 1.

Other embodiments of the light emitting apparatus include a gate metal, a wide bandgap semiconductor, a Ge or $Si_{1-z}Ge_z$ channel to radiate via direct band transition, a buffer comprised of silicon and germanium and a silicon substrate. The gate metal is positioned between a p-type contact and an n-type contact. The wide bandgap semiconductor is positioned below and attached to the gate metal. The Ge or $Si_{1-z}Ge_z$ channel is positioned below and attached to the wide bandgap semiconductor. The silicon substrate is positioned below and attached to the buffer.

A high stress dielectric film may be positioned above and attached to the gate metal in some embodiments of the light emitting apparatus.

Preferably, the buffer includes two types of buffers. The buffer may include a relaxed $Si_{1-x}Ge_x$ buffer positioned below and attached to the Ge or $Si_{1-z}Ge_z$ channel and a graded $Si_{1-y}Ge_y$ buffer positioned below and attached to the relaxed $Si_{1-x}Ge_x$ buffer.

The gate metal, wide bandgap semiconductor, Ge or $Si_{1-z}Ge_z$ channel, relaxed $Si_{1-x}Ge_x$ buffer, graded $Si_{1-y}Ge_y$ buffer, may form a SiGe waveguide positioned on and attached to the silicon substrate. Preferably, y is between 0 and x, z is greater than or equal to x and x is between 0 and 1.

Embodiments of the light emitting apparatus may include a heterostructure. The heterostructure may consist essentially of or consist entirely of a gate metal, a gate oxide or other dielectric stack, a Ge or $Si_{1-z}Ge_z$ channel, a buffer comprised of silicon and germanium and a silicon substrate. The gate metal is positioned between a p-type contact and an n-type contact. The gate oxide or other dielectric stack is positioned below and attached to the gate metal. The Ge or $Si_{1-z}Ge_z$ channel is configured to radiate via direct band transition. The Ge or $Si_{1-z}Ge_z$ channel is positioned below and attached to the gate dielectric stack. The buffer is positioned below and attached to the Ge or $Si_{1-z}Ge_z$ channel. The silicon substrate is positioned below and attached to the buffer.

Other embodiments of the light emitting apparatus may include a heterostructure that consists essentially of or consist entirely of a gate metal, a wide bandgap semiconductor, a Ge or $Si_{1-z}Ge_z$ channel to radiate via direct band transition, a buffer comprised of silicon and germanium and a silicon substrate. The gate metal is positioned between a p-type contact and an n-type contact. The wide bandgap semiconductor is positioned below and attached to the gate metal. The Ge or $Si_{1-z}Ge_z$ channel is positioned below and attached to the wide bandgap semiconductor. The silicon substrate is positioned below and attached to the buffer.

Preferably, embodiments of the light emitting apparatus are sized and configured for manufacturing that utilizes one or more CMOS fabrication processes.

Other details, objects, and advantages of the invention will become apparent as the following description of certain present preferred embodiments thereof and certain present preferred methods of practicing the same proceeds.

BRIEF DESCRIPTION OF THE DRAWINGS

Present preferred embodiments of the light emitting apparatus are shown in the accompanying drawings in which.

DETAILED DESCRIPTION OF PRESENT PREFERRED EMBODIMENTS

A germanium gain medium in an efficient light source preferably (1) exhibits direct band transition to eliminate the dependence on the phonon density in the material, (2) exhibits high radiation efficiency even at low or intermediate injection levels, (3) features low impurity doping concentration for reduced density of nonradiative recombination centers and low Auger recombination rate, and (4) avoids tunnel injection of carriers where carrier injection efficiency is lowered by carrier trapping and de-trapping cycles. None of the existing technologies can satisfy all of the above requirements simultaneously. Instead, conventional techniques try and provide a design that meets or optimizes only some of the above identified preferences.

It is contemplated that direct band radiation from germanium and silicon-germanium based on free electron accumulation/inversion in metal-oxide (insulator)-semiconductor (MOS/MIS) and modulation-doped (MOD) heterojunctions can provide a light emitting device design that can be optimized for all of the above preferences. Inducing a high concentration of electrons in the thin channel regions of lightly-doped intrinsic bulk or epitaxial layers of Ge or SiGe can be achieved via (1) surface carrier accumulation/inversion in a metal-oxide (insulator)-semiconductor (MOS/MIS) configuration with a sufficient gate voltage, and (2) interface carrier accumulation by transfer doping across a heterojunction with a properly designed modulation doping profile. The channel electron concentrations can surpass certain critical values in order to fill the L valley of Ge or SiGe in the channel regions up to the energy level of the Γ valley minimum to boost the direct band radiative recombination across the latter bandgap; i.e. the electron quasi-Fermi level should rise above the direct Γ valley minimum. Consequently, efficient radiation and the needed optical gain can be produced in the channel region which then can be incorporated into design and fabrication of efficient Ge or SiGe LEDs, lasers and other light emitting devices.

Figure 1A:
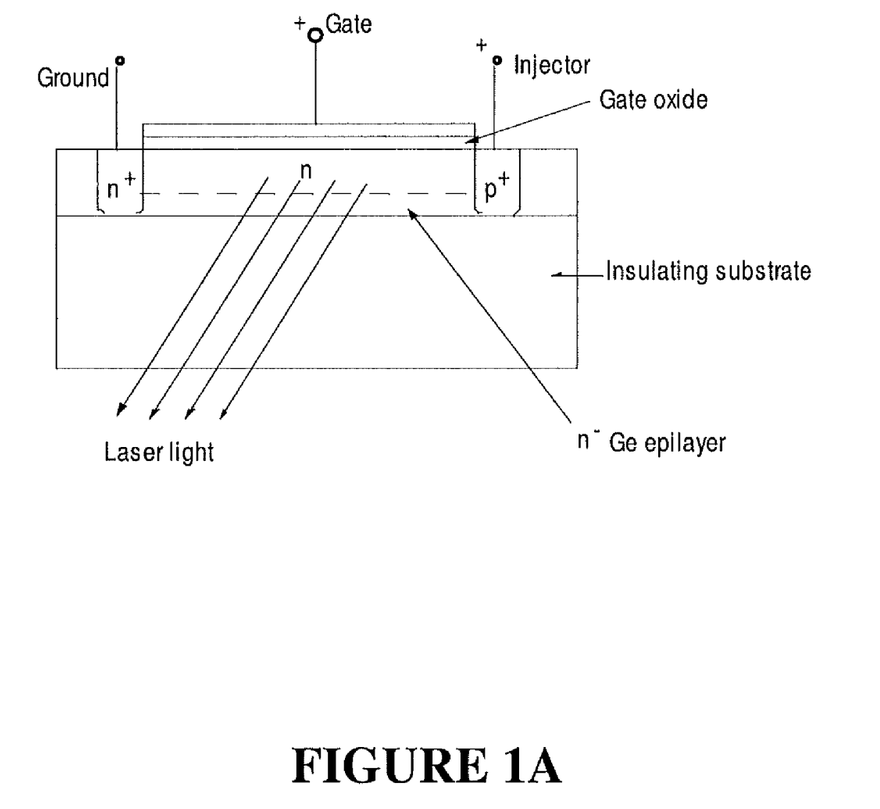
FIG. 1A is a schematic illustration of the direct band radiation from Ge or SiGe layers due to the free electron accumulation/inversion in the surface channels of a MOS/MIS structure.

FIG. 1A shows the schematic of an MOS/MIS structure that will produce optical gain by intervalley electron occupancy shift from the indirect L-valley to the direct Γ-valley. Under the application of a positive gate voltage, an electron accumulation layer (shown as 'n' above dotted line) is induced in the $n^-$ Ge epitaxial layer below. With sufficient gate voltage, the induced n-layer can have electron densities in the $10^{19}$-$10^{20}$ cm$^{-3}$ range, thereby enabling occupancy of electrons in the direct Γ-valley states and hence providing the means for population inversion across the direct bandgap and optical gain. Since this induced layer is formed in an $n^-$ or even intrinsic semiconductor region, containing only a sparse density of dopants, the problems of dopant-related recombination losses are greatly reduced. A $p^+$ region is formed to inject holes (under forward bias) into the induced n-layer for radiative recombination at the 0.8 eV (1.55 µm) direct transition, and an $n^+$ region as the return ground electrode for completing the current injection circuit. The latter $n^+$ region also forms a high-low junction with the induced n-layer, thereby providing the highly desired confinement of the injected minority electrons for enhanced optical gain. The $p^+$ and $n^+$ regions may be formed by conventional ion implantation after lithographic patterning. The n+ layer may also be replaced by an ohmic contact made of appropriate metal in some cases.

Figure 1B:
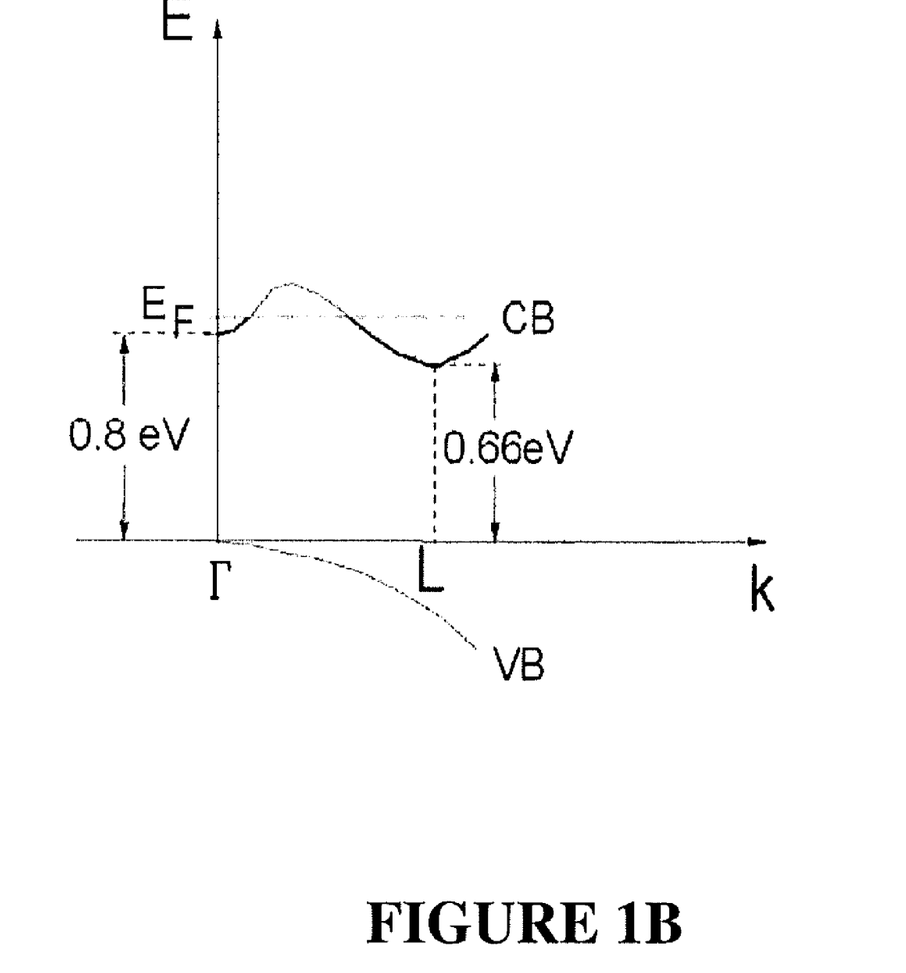
FIG. 1B is a schematic graph of the intervalley electron occupancy shift from the indirect L-valley to the direct Γ-valley due to electron accumulation.

The transfer of occupancy of electron states from the indirect L-valley to the direct Γ-valley can be seen in the electron energy-momentum plot (E-k diagram) shown in FIG. 1B. As the Fermi energy $E_F$ is pushed up higher in the conduction band by ever-increasing positive gate bias, eventually the direct Γ-valley states are occupied with electrons, thus achieving the potential for an active optical medium for lasing. In the figure, the thicker lines in the conduction band correspond to the occupied states below the Fermi energy.

Figure 2A:
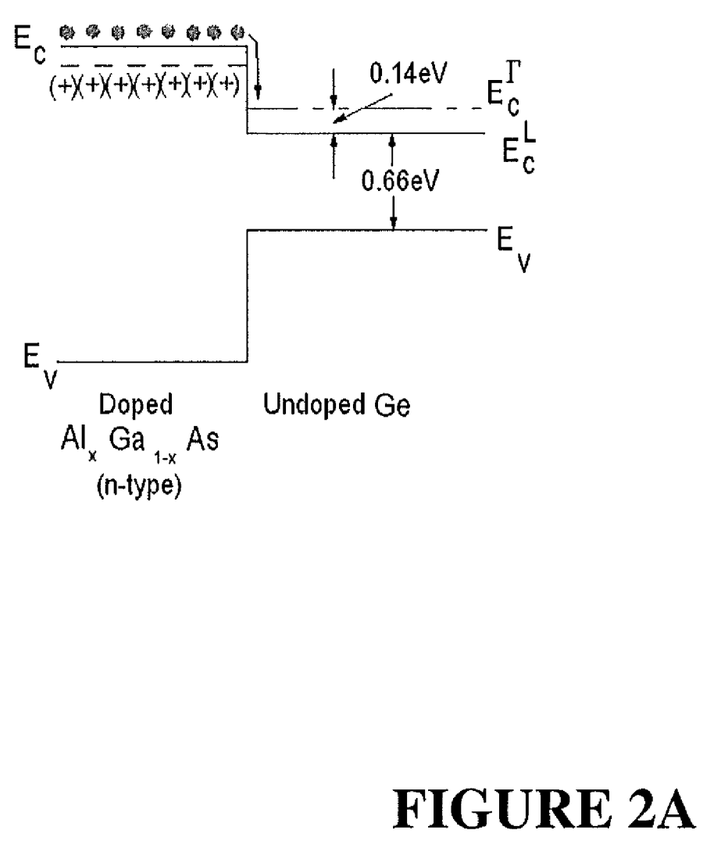
FIG. 2A is a band line-up of a present preferred modulation-doped AlGaAs/Ge heterojunction before electron transfer.
Figure 2B:
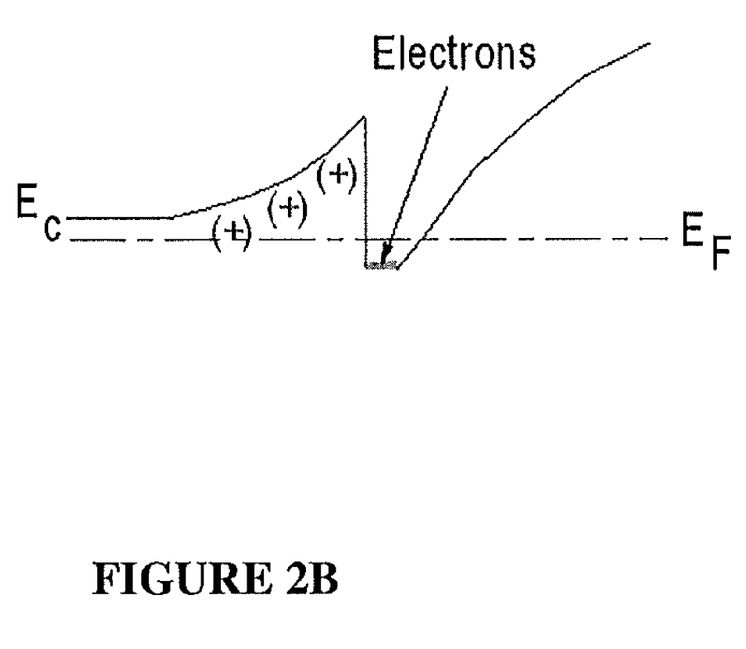
FIG. 2B is a band line-up of a present preferred modulation-doped AlGaAs/Ge heterojunction after electron transfer.

FIG. 2 shows a present preferred modulation-doped heterojunction structure that can also render Ge or SiGe to emit light efficiently and serve as an optical gain medium for lasing. In this structure, a lightly doped or undoped Ge or SiGe layer is placed adjacent to a heavily n-type doped semiconductor layer of wider bandgap, such as AlGaAs, to form a heterojunction. In such 'modulation doping' across a heterojunction interface, the wide bandgap semiconductor (#1) is doped with a high concentration of donors, while the lower gap material (#2) is left undoped. The downward conduction band step from #1 to #2 causes the free electrons released from the donors in the former to readily slide into the conduction band of the latter. The resulting space charge regions and band bending at the junction interface then forces the mobile electrons separated from their parent donor impurities in the wide bandgap semiconductor to accumulate in a Ge or SiGe interface potential well formed adjacent to the interface.

The above transfer doping across a heterojunction interface offers another distinct advantage because the electrons accumulating at the interface in effect form a two dimensional electron gas (2-DEG) channel with attendant 'lift' in the lowest energy level of this two dimensional system well above the conduction band minimum. Getting electrons at energies above $Ec^\Gamma$ becomes easier because of this additional phenomenon.

The concentration of the channel electrons can be further increased by properly biasing the heterojunction. Consequently, a high concentration of free electrons can be generated in a thin surface channel of Ge or SiGe, which will fill the L valley of Ge or SiGe in the channel region up to the level that energetically matches the minimum of the Γ valley to boost the direct band radiative recombination therein. It should be appreciated that a low concentration of impurities in the Ge or SiGe surface channels will lead to high-efficiency radiation from Ge or SiGe.

There are at least two methods that may be utilized for introducing free holes into the electron-accumulated channel region for radiative recombination. A first method involves the planar design of p and n-type contacts that is similar to the aforementioned MOS/MIS emitter design: a $p^+$ region is formed to inject holes (under forward bias) into the induced n-layer for radiative recombination at the 0.8 eV (1.55 µm) direct transition, and an $n^+$ region as the return ground electrode for completing the current injection circuit. The $p^+$ and $n^+$ regions are located laterally at each side of the channel and may be formed by conventional ion implantation after lithographic patterning. The $n^+$ layer may also be replaced by an ohmic contact made of appropriate metal. It should be understood that this first method may be applicable for MOS/MIS designs and MOD designs.

In a second method, free holes can be injected vertically from the bottom layers that underlie the channel region. This can be accomplished by designing p-doped SiGe and Si layers/substrates underneath the channel region for p-type ohmic contact with the top $n^+$ doped wide bandgap semiconductor acting as the n-type contact. In this scheme, the channel electrons will be replenished by electron injection from the top electrode. It should be understood that the second method may be used for MOD designs.

In designing direct band radiation-based Ge or $Si_{1-x}Ge_x$ light emitting diodes or lasers using the accumulation/inversion-induced high-concentration electrons in the MOS/MIS or modulation doped (MOD) heterojunctions, the absorption loss in the device regions surrounding the Ge or $Si_{1-x}Ge_x$ emissive channels can be minimized. It should be understood that this can be accomplished in various ways. For instance, absorption loss may be minimized by (1) designing widebandgap $Si_{1-y}Ge_y$ underlying structures next to the thin layers of (~5-10 nm) Ge or $Si_{1-x}Ge_x$ (x>y) channels to minimize the semiconductor losses in both MOS/MIS and modulation doped heterojunction structures, (2) minimizing the free carrier absorption losses outside the channels with properly doped $Si_{1-y}Ge_y$ layers in the design or (3) employing transparent conductors, such as polycrystalline silicon (for 1.55 µm IR) and ITO, as gate materials; the gate dielectrics of course will be transparent to the emitted radiation.

Preferably, the density of defect/impurity-induced nonradiative recombination centers in the emissive channels should also be reduced as much as possible. In the MOS/MIS configuration, a viable high-k gate dielectric stack may feature low interface roughness and low densities of interface traps and surface states, as well as proper passivation of the surface of SiGe or Ge channel region for reduced dangling-bond defects. The possible candidates of the gate dielectric may include, but are not limited to, deposited thin films of $ZrO_2$, $Al_2O_3$, $HfO_2$, $CeO_2$ and $BaTiO_3$ as well as their stacks. In addition, the techniques of silicon surface passivation can also be employed to minimize density of traps/defects in the surface channels. For instance, an ultra thin layer of Si (1-3 nm) can be epitaxially grown over SiGe or Ge channels to passivate the surface and to provide the high quality $SiO_2$ gate dielectric. For the modulation doped heterojunction design, it is important to epitaxially grow wide bandgap semiconductors over SiGe or Ge channel layers with low-defect or defect-free interfaces.

In order to integrate the Ge or $Si_{1-x}Ge_x$ light emitting diodes or laser diodes with silicon, a graded relaxed buffer configuration in the device heterostructure design can be employed. Thin layers of Ge or $Si_{1-x}Ge_x$ can be lattice-matched or pseudomorphically grown over the relaxed buffer free of dislocations. In addition, the surface channel emission mechanism in embodiments of our device may also allow for strain engineering of the channel regions via special gate design and processing. For instance, a tensile strained nitride capping layer can be patterned over the gate/channel region to introduce channel strain, which, in turn, lifts up the light-heavy hole degeneration at the valence band extreme and lowers the energy difference between the direct ($\Gamma$) and indirect (L) conduction band valleys in the channel region for the enhanced radiation efficiency and optical gain.

Figure 3A:
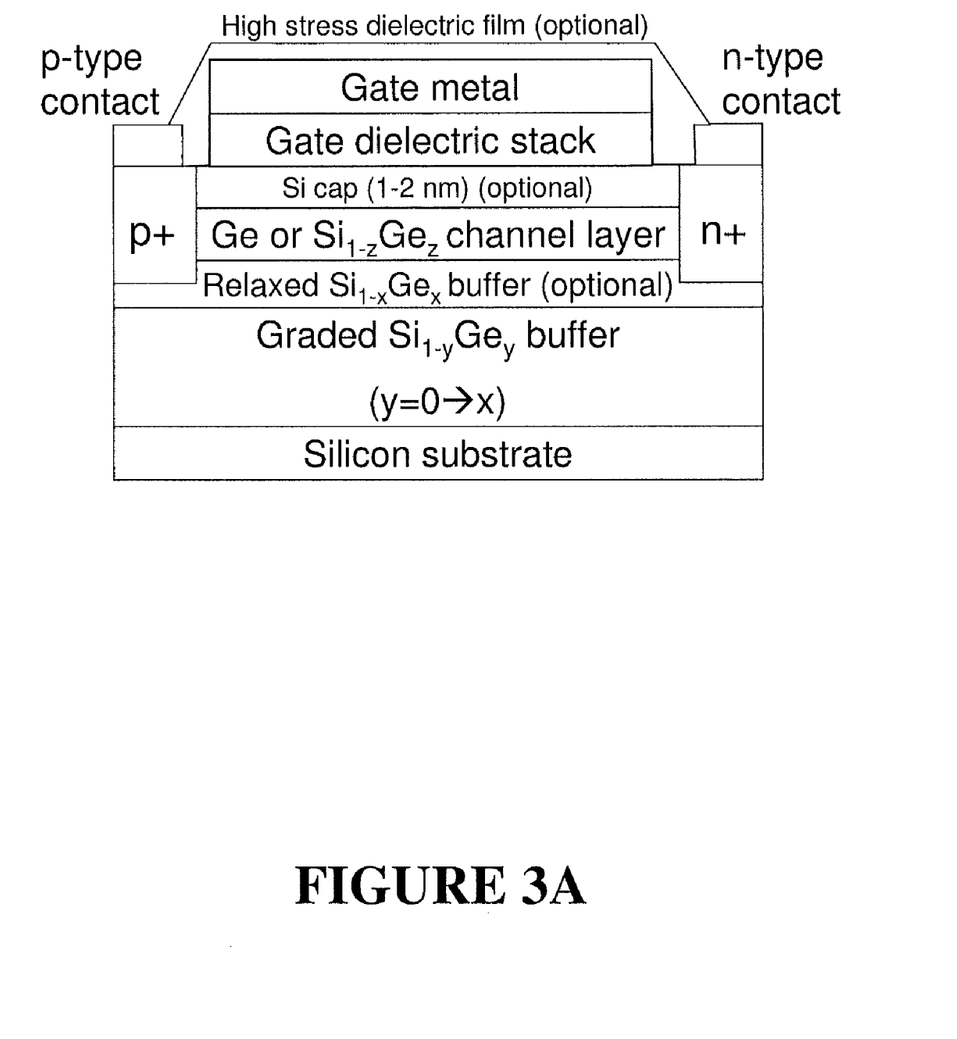
FIG. 3A is a schematic of a heterostructure of a first present preferred MOS/MIS Ge or $Si_{1-x}Ge_x$ LED/laser diode based on direct band radiation channels of electron accumulation or inversion.

FIG. 3A shows schematically a first present preferred configuration of a direct band radiation-based Ge or $Si_{1-x}Ge_x$ light emitting diode using MOS/MIS channels of high electron concentrations induced by the accumulation/inversion effect. The light emitting diode may be fabricated such that its structure includes a number of layers. It should be appreciated that each layer of the light emitting device shown in FIG. 3A may be formed on the top of a lower layer. The device heterostructure of the light emitting device shown in FIG. 3A may include, starting from the bottom, silicon substrate, a graded relaxed buffer $Si_{1-y}Ge_y$ layer (y=0→x), a relaxed $Si_{1-x}Ge_x$ buffer layer, an undoped or lightly doped, lattice matched or pseudomorphic layer of $Si_{1-z}Ge_z$ or Ge channel (z≧x), an ultra thin silicon passivation layer, a gate dielectric stack (e.g., $SiO_2$, $ZrO_2$, $Al_2O_3$, $HfO_2$, $CeO_2$, $BaTiO_3$, etc.), and the gate conductor (e.g., ITO, polycrystalline silicon, etc.). In addition, $p^+$ and an $n^+$ wells are formed at each side of the channel by ion implantation after lithographic patterning, or by selective regrowth following the patterned etching step. Suitable ohmic contact metals are patterned and deposited over the heavily-doped $p^+$ and $n^+$ well regions needed for efficient injection of holes and electrons into the channel region. An optional stress capping layer may also be deposited over the gate/channel region to induce channel strain by design. The emitted light can be effectively extracted from either a direction normal to the substrate or an edge of the wafer.

The MOS/MIS LED of FIG. 3A may be operated as a three terminal device. The gate can be biased to induce the accumulation/inversion of electrons in the surface channels for onset of the direction radiation therein while the electrons and holes are injected, respectively, from the p-type and n-type contacts for radiative recombination in the channel region. The valance band discontinuity between the channel layer and the underneath buffer can be utilized to confine the holes in the channel region to facilitate their radiative recombination with the electrons induced by accumulation/inversion therein.

It should be appreciated that other embodiments of a direct band radiation based Ge or $Si_{1-x}Ge_x$ light emitting diode using MOS/MIS channels of high electron concentrations induced by the accumulation/inversion effect may include a structure formed by the following layers, starting from the bottom: a silicon substrate, a graded relaxed buffer $Si_{1-y}Ge_y$ layer (y=0→x), an undoped or lightly doped, lattice matched or pseudomorphic layer of $Si_{1-z}Ge_z$ or Ge channel (z≧x), a gate dielectric stack (e.g., $SiO_2$, $ZrO_2$, $Al_2O_3$, $HfO_2$, $CeO_2$, $BaTiO_3$, etc.), and a gate conductor (e.g., ITO, polycrystalline silicon, etc.). In addition, $p^+$ and an $n^+$ wells may be formed at each side of the channel by ion implantation after lithographic patterning, or by selective regrowth following the patterned etching step. Suitable ohmic contact metals may be patterned and deposited over the heavily-doped $p^+$ and $n^+$ well regions needed for efficient injection of holes and electrons into the channel region.

Yet other embodiments of our direct band radiation based Ge or $Si_{1-x}Ge_x$ light emitting diode using MOS/MIS channels of high electron concentrations induced by the accumulation/inversion effect may include a structure formed by the following layers, starting from the bottom: a silicon substrate, a graded relaxed buffer $Si_{1-y}Ge_y$ layer (y=0→x), a relaxed $Si_{1-x}Ge_x$ buffer layer (optional), lattice matched or pseudomorphic layer of $Si_{1-z}Ge_z$ or Ge channel (z≧x), a gate dielectric stack (e.g., $SiO_2$, $ZrO_2$, $Al_2O_3$, $HfO_2$, $CeO_2$, $BaTiO_3$, etc.), and a gate conductor (e.g., ITO, polycrystalline silicon, etc.).

Yet other embodiments of our a direct band radiation based Ge or $Si_{1-x}Ge_x$ light emitting diode using MOS/MIS channels of high electron concentrations induced by the accumulation/inversion effect may include a structure formed by the following layers, starting from the bottom: a silicon substrate, a graded relaxed buffer $Si_{1-y}Ge_y$ layer (y=0→x), lattice matched or pseudomorphic layer of $Si_{1-z}Ge_z$ or Ge channel (z≧x), an ultra thin silicon passivation layer, a gate dielectric stack (e.g., $SiO_2$, $ZrO_2$, $Al_2O_3$, $HfO_2$, $CeO_2$, $BaTiO_3$, etc.), and a gate conductor (e.g., ITO, polycrystalline silicon, etc.).

Figure 3B:
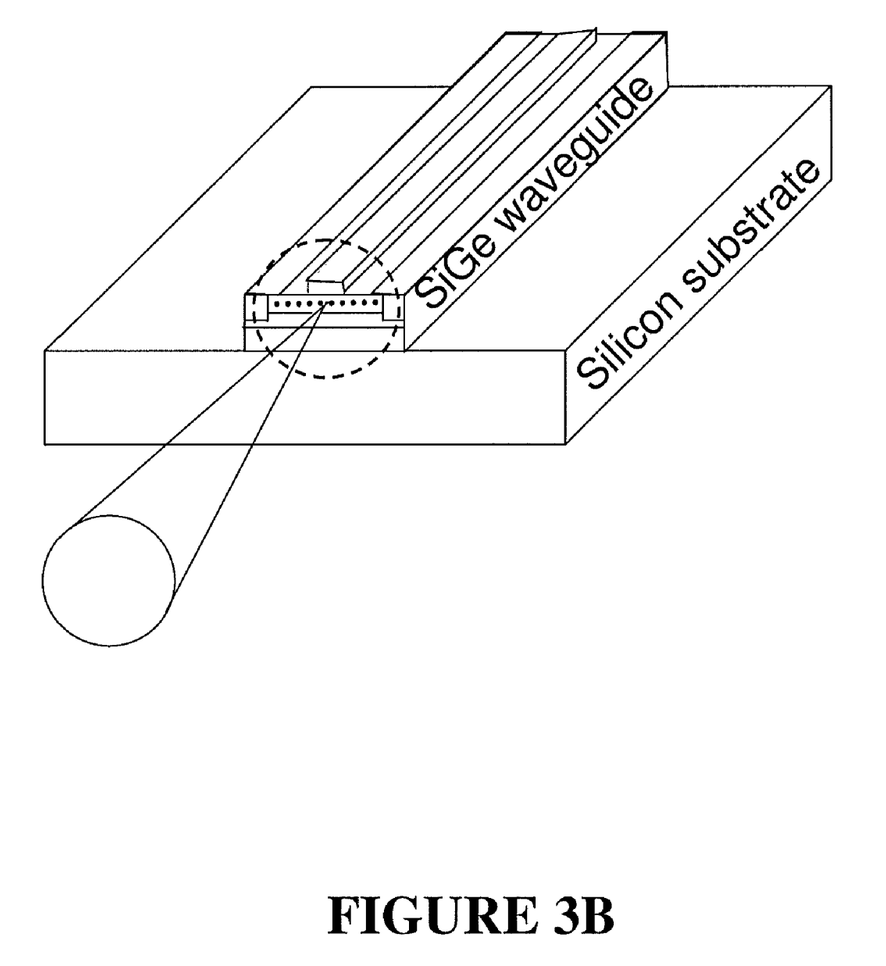
FIG. 3B is a schematic of the waveguide structure in a first present preferred embodiment of a laser device.

FIG. 3B shows an extension of the device configuration of FIG. 3A to illustrate a first present preferred stripe geometry laser diode. In conjunction with the earlier steps, the stripes of the heterostructure are patterned and etched into waveguide cavity to confine the light wave that oscillates between a pair of parallel mirrors formed by the cleaved Si/SiGe facets at the edges of the waveguide. The MOS/MIS laser diode will be operated as a three terminal device: the gate biased to induce the accumulation/inversion of electrons in the surface channels for onset of the direction radiation therein, while the electrons and holes are injected, respectively, from the p-type and n-type metal contacts for the radiative recombination in the channel region. The lasing output is coupled outside from the edge mirrors.

Figure 4A:
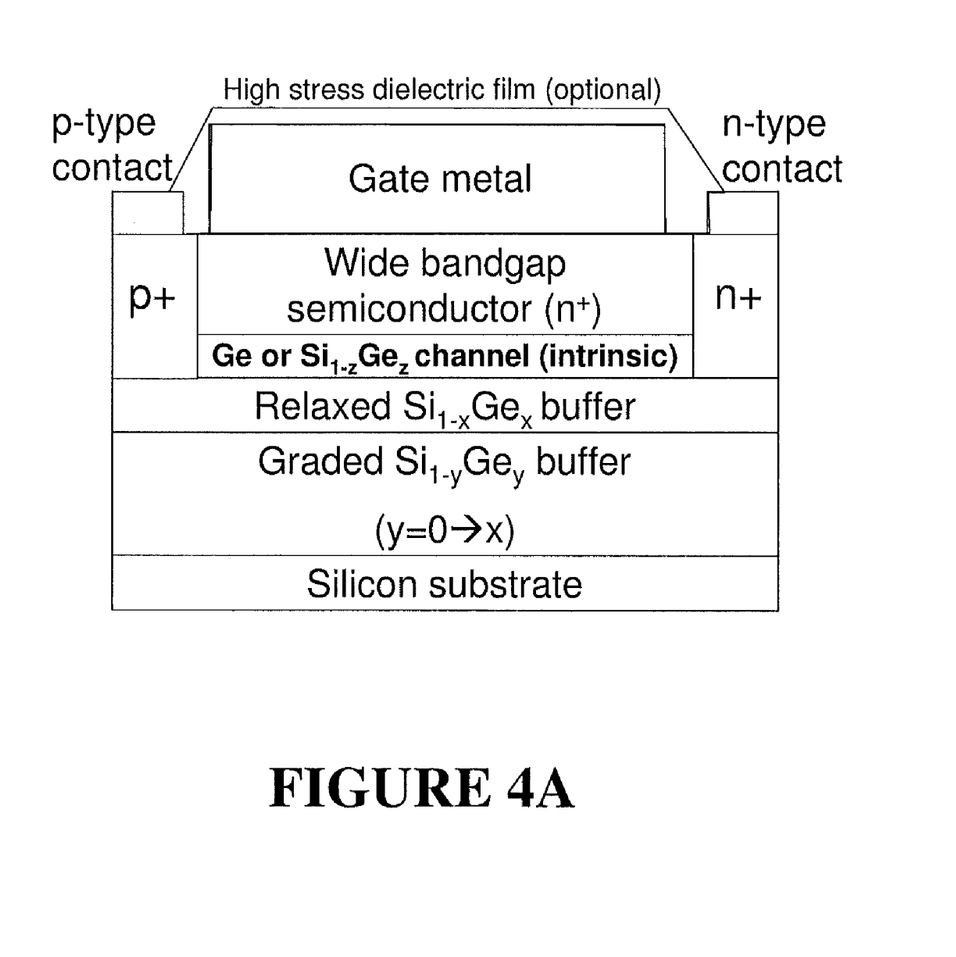
FIG. 4A is a schematic of a present preferred heterostructure of a first present preferred modulation doped heterojunction Ge or $Si_{1-x}Ge_x$ LED/laser diode based on direct band radiation channels of electron accumulation or inversion.

FIG. 4A shows schematically a first present preferred device configuration of a direct band radiation-based Ge or $Si_{1-x}Ge_x$ light emitting diode using a modulation doped heterojunction. The device heterostructure consists of, starting from the bottom silicon substrate, a graded relaxed buffer $Si_{1-y}Ge_y$ layer (y=0→x), an undoped or lightly doped, lattice matched $Si_{1-x}Ge_x$ layer, an undoped or lightly doped, pseudomorphic layer of $Si_{1-z}Ge_z$ or Ge channel (z>x), a wide bandgap semiconductor layer, such as AlGaAs, and the gate conductor (ITO, polycrystalline silicon, etc). In addition, a $p^+$ well and an $n^+$ well are formed at either side of the channel by ion implantation after lithographic patterning or selective regrowth following the patterned etching step. p− and n− contact metals are patterned and deposited over the heavily-doped $p^+$ and $n^+$ well regions for efficient injection of holes and electrons into the channel region. Finally, a stress capping layer may also be deposited over the gate/channel region to induce the channel strain by design. It should be understood that alternative embodiments may not include a stress capping layer.

The emitted light from the embodiment of the light emitting apparatus of FIG. 4A can be effectively extracted from either a direction normal to the substrate or an edge of the wafer. The MOD LED will be operated as a three terminal device: the gate biased to induce the accumulation of electrons in the surface channels for onset of direct, Γ-gap radiation therein, while the electrons and holes are injected, respectively, from the n⁺ and p⁺ regions for radiative recombination in the channel region. The valance band discontinuity between the channel layer and the underneath buffer can be utilized to confine the holes in the channel region to facilitate their radiative recombination with the electrons induced by accumulation/inversion therein.

Figure 4B:
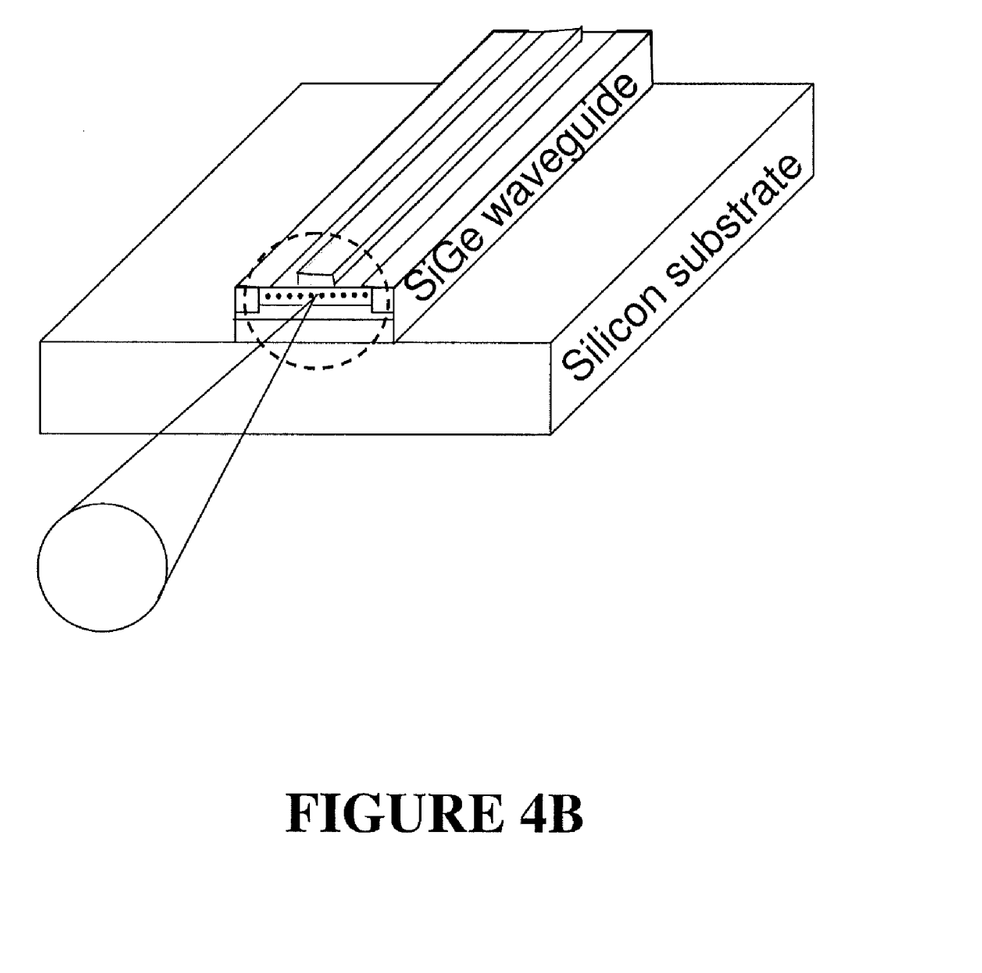
FIG. 4B is a schematic of a first present preferred waveguide structure that may be utilized in a laser device.

FIG. 4B shows an extension of the device configuration of FIG. 4A to illustrate a present preferred stripe geometry laser diode. In conjunction with the earlier steps, the stripes of the heterostructure are patterned and etched into a waveguide cavity to confine the light wave that oscillates between a pair of parallel mirrors formed by the cleaved Si/SiGe facets at the edges of the waveguide. The MOD laser diode will be operated as a three terminal device: the gate biased to induce the accumulation/inversion of electrons in the surface channels for onset of the direction radiation therein, while the electrons and holes are injected, respectively, from the p-type and n-type contacts for the radiative recombination in the channel region. The lasing output is coupled outside from the edge mirrors.

It should appreciated that embodiments of our light emitting apparatus may be sized and configured for use in high-performance, current-injected on-chip lasers, light emitting diodes or other light emitting devices that can be monolithically fabricated on silicon. Preferably, such embodiments operate at an optical communication wavelength above 1.1 micrometers (μm). The fabrication of such embodiments of our light emission devices are preferably configured so that they may be manufactured utilizing CMOS technology.

It is contemplated that embodiments of the light emitting apparatus may include the following properties: (1) exhibit direct band transition to eliminate the dependence on the phonon density in the material, (2) exhibit high radiation efficiency even at low or intermediate injection levels, (3) feature low impurity doping for reduced density of nonradiative recombination centers and low Auger recombination rate, and (4) avoid tunnel injection of carriers where carrier injection efficiency is lowered by carrier trapping and de-trapping cycles. While conventional devices may fail to have all four of these properties, it is contemplated that embodiments of the light emitting apparatus may have all four of these properties and that designs for embodiments of the light emitting apparatus may be configured to optimize all of four of these properties.

While certain present preferred embodiments of LEDs, laser diodes, and other light emitting apparatuses have been discussed and illustrated herein and certain present preferred methods of making and using the same have also been discussed and illustrated, it is to be distinctly understood that the invention is not limited thereto but may be otherwise variously embodied and practiced within the scope of the following claims.

We claim:

1. A light emitting apparatus comprising:
a gate metal positioned between a p-type contact and an n-type contact;
a gate oxide or other dielectric stack positioned below and attached to the gate metal;
a Ge or $Si_{1-z}Ge_z$ channel to radiate via direct band transition, the Ge or $Si_{1-z}Ge_z$ channel positioned below and attached to the gate dielectric stack;
a buffer comprised of silicon and germanium; and
a silicon substrate positioned below and attached to the buffer.

2. The light emitting apparatus of claim 1 wherein the buffer is comprised of at least one of an at least partially relaxed $Si_{1-x}Ge_x$ buffer and a graded $Si_{1-y}Ge_y$ buffer, the at least partially relaxed $Si_{1-x}Ge_x$ buffer positioned below and attached to the Ge or $Si_{1-z}Ge_z$ channel, the graded $Si_{1-y}Ge_y$ buffer positioned below and attached to the at least partially relaxed $Si_{1-x}Ge_x$ buffer.

3. The light emitting apparatus of claim 1 further comprising a high stress dielectric film positioned above and attached to the gate metal.

4. The light emitting apparatus of claim 1 wherein the silicon substrate is a silicon wafer.

5. The light emitting apparatus of claim 2 further comprising a silicon cap positioned between the gate dielectric stack and the Ge or $Si_{1-z}Ge_z$ channel layer.

6. The light emitting apparatus of claim 5 wherein y=0→x and z≧x and x is a value between 0 and 1.

7. The light emitting apparatus of claim 5 wherein z is a value between 0 and 1 and z is a value that is greater than or equal to x.

8. A light emitting apparatus comprising:
a gate metal positioned between a p-type contact and an n-type contact;
a wide bandgap semiconductor positioned below and attached to the gate metal;
a Ge or $Si_{1-z}Ge_z$ channel to radiate via direct band transition, the Ge or $Si_{1-z}Ge_z$ channel positioned below and attached to the wide bandgap semiconductor;
a buffer comprised of silicon and germanium; and
a silicon substrate positioned below and attached to the buffer.

9. The light emitting apparatus of claim 8 further comprising a high stress dielectric film positioned above and attached to the gate metal.

10. The light emitting apparatus of claim 8 wherein the buffer is comprised of at least one of an at least partially relaxed $Si_{1-x}Ge_x$ buffer and a graded $Si_{1-y}Ge_y$ buffer, the at least partially relaxed $Si_{1-x}Ge_x$ buffer positioned below and attached to the Ge or $Si_{1-z}Ge_z$ channel, the graded $Si_{1-y}Ge_y$ buffer positioned below and attached to the at least partially relaxed $Si_{1-x}Ge_x$ buffer.

11. The light emitting apparatus of claim 10 wherein the gate metal, wide bandgap semiconductor, Ge or $Si_{1-z}Ge_z$ channel, relaxed $Si_{1-x}Ge_x$ buffer, and graded $Si_{1-y}Ge_y$ buffer form a SiGe waveguide positioned on and attached to the silicon substrate.

12. The light emitting apparatus of claim 11 wherein y=0→x and z≧x and x is a value between 0 and 1.

13. A light emitting apparatus comprising a heterostructure, the heterostructure consisting essentially of
a gate metal positioned between a p-type contact and an n-type contact,
a gate oxide or other dielectric stack positioned below and attached to the gate metal,
a Ge or $Si_{1-z}Ge_z$ channel to radiate via direct band transition, the Ge or $Si_{1-z}Ge_z$ channel positioned below and attached to the gate dielectric stack,
a buffer comprised of silicon and germanium, and
a silicon substrate positioned below and attached to the buffer;
or the heterostructure consisting essentially of:
a gate metal positioned between a p-type contact and an n-type contact,
a wide bandgap semiconductor positioned below and attached to the gate metal, a Ge or $Si_{1-z}Ge_z$ channel to radiate via direct band transition, the Ge or $Si_{1-z}Ge_z$ channel positioned below and attached to the wide bandgap semiconductor,
a buffer comprised of silicon and germanium, and
a silicon substrate positioned below and attached to the buffer.

14. The light emitting apparatus of claim 13 wherein the heterostructure consists of
the gate metal;
the gate oxide or other dielectric stack;
the Ge or $Si_{1-z}Ge_z$ channel;
the buffer; and
the silicon substrate.

15. The light emitting apparatus of claim 13 wherein the heterostructure consists of:
the gate metal;
the wide bandgap semiconductor;
the Ge or $Si_{1-z}Ge_z$ channel;
the buffer; and
the silicon substrate; and
wherein the heterostructure is modulation doped.

16. The light emitting apparatus of claim 13 wherein the buffer is comprised of at least one of an at least partially relaxed $Si_{1-x}Ge_x$ buffer and a graded $Si_{1-y}Ge_y$ buffer, the at least partially relaxed $Si_{1-x}Ge_x$ buffer positioned below and attached to the Ge or $Si_{1-z}Ge_z$ channel, the graded $Si_{1-y}Ge_y$ buffer positioned below and attached to the at least partially relaxed $Si_{1-x}Ge_x$ buffer.

17. The light emitting apparatus of claim 16 wherein the gate metal, wide bandgap semiconductor, Ge or $Si_{1-z}Ge_z$ channel, relaxed $Si_{1-x}Ge_x$ buffer, and graded $Si_{1-y}Ge_y$ buffer form a SiGe waveguide positioned on and attached to the silicon substrate.

18. The light emitting apparatus of claim 17 wherein $y=0 \rightarrow x$ and $z \geq x$ and x is a value between 0 and 1.

19. The light emitting apparatus of claim 13 wherein the silicon substrate is silicon wafer.

* * * * *